(12) United States Patent
Van Der Blij et al.

(10) Patent No.: US 9,136,151 B2
(45) Date of Patent: Sep. 15, 2015

(54) ACTUATOR

(75) Inventors: Fredrik Wilhelm Van Der Blij, Waalre (NL); Edwin Johan Buis, Belfeld (NL); Pieter Renaat Maria Hennus, Peer (BE); Johannes Charles Adrianus Van Den Berg, Prinsenbeek (NL); Johannes Andreas Henricus Maria Jacobs, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 849 days.

(21) Appl. No.: 13/168,502

(22) Filed: Jun. 24, 2011

(65) Prior Publication Data

US 2012/0162628 A1 Jun. 28, 2012

Related U.S. Application Data

(60) Provisional application No. 61/359,595, filed on Jun. 29, 2010.

(51) Int. Cl.
*G03B 27/52* (2006.01)
*H01L 21/677* (2006.01)
*H01L 21/67* (2006.01)
*G03F 7/20* (2006.01)

(52) U.S. Cl.
CPC ........ *H01L 21/67742* (2013.01); *G03F 7/7075* (2013.01); *H01L 21/67126* (2013.01)

(58) Field of Classification Search
CPC ............. G03F 7/70816; H01L 21/67126; H01L 21/67742
USPC ............... 355/72, 73, 30; 277/303, 412
See application file for complete search history.

(56) References Cited

U.S. PATENT DOCUMENTS

| 5,085,443 | A  | * | 2/1992 | Richards  ................... 277/412 |
| 5,344,160 | A  | * | 9/1994 | Scarlata et al.  ............ 277/347 |
| 5,403,019 | A  | * | 4/1995 | Marshall  .................... 277/413 |
| 6,559,922 | B2 |   | 5/2003 | Hansell et al. |
| 6,590,747 | B1 | * | 7/2003 | Boutaghou et al.  ........ 360/294.3 |

(Continued)

FOREIGN PATENT DOCUMENTS

JP 02-212624 A 8/1990
JP 11-176787 A 7/1999

(Continued)

OTHER PUBLICATIONS

English language Abstract of Japanese Patent Publication No. 02-212624 A, published Aug. 23, 2003; 1 page.

(Continued)

*Primary Examiner* — Deoram Persaud
(74) *Attorney, Agent, or Firm* — Sterne, Kessler, Goldstein & Fox P.L.L.C.

(57) ABSTRACT

An actuator comprising a first part and a second part, the first part being configured to move relative to the second part, wherein a labyrinth seal is provided between the first part and the second part, the labyrinth seal being configured to restrict the flow of gas from a first side of the labyrinth seal to a second side of the labyrinth seal, wherein one or more inlets and one or more outlets are provided within the labyrinth seal, the one or more inlets being configured to provide gas to a location within the labyrinth seal and the one or more outlets being configured to remove at least part of the gas from a location within the labyrinth seal.

16 Claims, 4 Drawing Sheets

(56) References Cited

U.S. PATENT DOCUMENTS

| | | |
|---|---|---|
| 6,721,389 B2 | 4/2004 | Van Der Werf et al. |
| 6,774,374 B1 | 8/2004 | Driessen et al. |
| 7,248,332 B2 | 7/2007 | Owen |
| 7,549,836 B2 * | 6/2009 | Anderson et al. ............. 415/113 |
| 8,115,901 B2 | 2/2012 | Hayashi |
| 2001/0020199 A1 * | 9/2001 | Bacchi et al. ................. 700/245 |
| 2002/0128733 A1 * | 9/2002 | Sakino ............................ 700/56 |
| 2002/0176061 A1 * | 11/2002 | Sai ................................. 355/53 |
| 2004/0080113 A1 * | 4/2004 | Linden et al. ................. 277/412 |
| 2004/0094722 A1 | 5/2004 | Bisschops et al. |
| 2004/0100034 A1 * | 5/2004 | Coppola ....................... 277/412 |
| 2004/0100035 A1 * | 5/2004 | Turnquist et al. ............. 277/412 |
| 2004/0119238 A1 * | 6/2004 | Skumawitz et al. .......... 277/412 |
| 2004/0227924 A1 * | 11/2004 | Willems Van Dijk et al. .. 355/72 |
| 2005/0243328 A1 * | 11/2005 | Wegmann et al. ............ 356/520 |
| 2006/0008056 A1 | 1/2006 | Vadari et al. |
| 2008/0001363 A1 * | 1/2008 | Bhate ............................ 277/355 |
| 2008/0309893 A1 * | 12/2008 | Buis et al. ....................... 355/30 |
| 2009/0008881 A1 * | 1/2009 | Lee et al. ...................... 277/412 |
| 2009/0121440 A1 * | 5/2009 | Feistel et al. ................. 277/308 |
| 2010/0180854 A1 * | 7/2010 | Baumann et al. ......... 123/196 A |
| 2010/0269416 A1 * | 10/2010 | Esbenshade et al. ........... 51/298 |
| 2011/0294644 A1 * | 12/2011 | Kim et al. ....................... 501/11 |
| 2012/0082545 A1 * | 4/2012 | Peck et al. .................... 415/230 |

FOREIGN PATENT DOCUMENTS

| | | |
|---|---|---|
| JP | 2000-340502 A | 12/2000 |
| JP | 2002-096011 A | 2/2002 |
| JP | 2002-124463 A | 4/2002 |
| JP | 2003-532304 A | 10/2003 |
| JP | 2005-123256 A | 5/2005 |
| JP | 2006-032957 A | 2/2006 |
| JP | 2007-189073 A | 7/2007 |
| JP | 2009-129935 A | 6/2009 |
| WO | WO 2009/127391 A1 | 10/2009 |

OTHER PUBLICATIONS

English language Abstract of Japanese Patent Publication No. 11-176787 A, published Jul. 2, 1999; 1 page.

English language Abstract of Japanese Patent Publication No. 2007-189073 A, published Jul. 26, 2007; 1 page.

* cited by examiner

ACTUATOR

CROSS REFERENCE TO RELATED APPLICATIONS

This application claims benefit under 35 U.S.C. 119(e) to U.S. Provisional Application No. 61/359,595, filed Jun. 29, 2010, which is incorporated by reference herein in its entirety.

BACKGROUND OF THE INVENTION

1. Field of the Invention

The present invention relates to an actuator that may form part of a lithographic apparatus.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in the following equation:

$$CD = k_1 * \frac{\lambda}{NA}$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

It is usually necessary to move a substrate within a lithographic apparatus. The substrate may for example be moved from a substrate storage location to a location where the substrate may be patterned by the lithographic apparatus. An actuator may be used to move the substrate. One or more motors may be provided within the actuator. The one or more motors may generate contamination.

It may be desirable to reduce the likelihood that the contamination travels from the motor to a substrate, or to some other location in the lithographic apparatus.

According to a first aspect of the invention there is provided an actuator comprising a first part and a second part, the first part being configured to move relative to the second part, wherein a labyrinth seal is provided between the first part and the second part, the labyrinth seal being configured to restrict the flow of gas from a first side of the labyrinth seal to a second side of the labyrinth seal, wherein one or more inlets and one or more outlets are provided within the labyrinth seal, the one or more inlets being configured to provide gas to a location within the labyrinth seal and the one or more outlets being configured to remove at least part of the gas from a location within the labyrinth seal.

According to a second aspect of the invention there is provided a method of sealing an actuator using a labyrinth seal, the method comprising introducing gas into the labyrinth seal via one or more inlets connected to a location within the labyrinth seal, and removing gas from the labyrinth seal via one or more outlets connected to a location within the labyrinth seal.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein

BRIEF DESCRIPTION OF THE DRAWINGS

Embodiments of the invention will now be described, by way of example only, with reference to the accompanying schematic drawings in that corresponding reference symbols indicate corresponding parts, and in which.

DETAILED DESCRIPTION OF THE INVENTION

Figure 1:
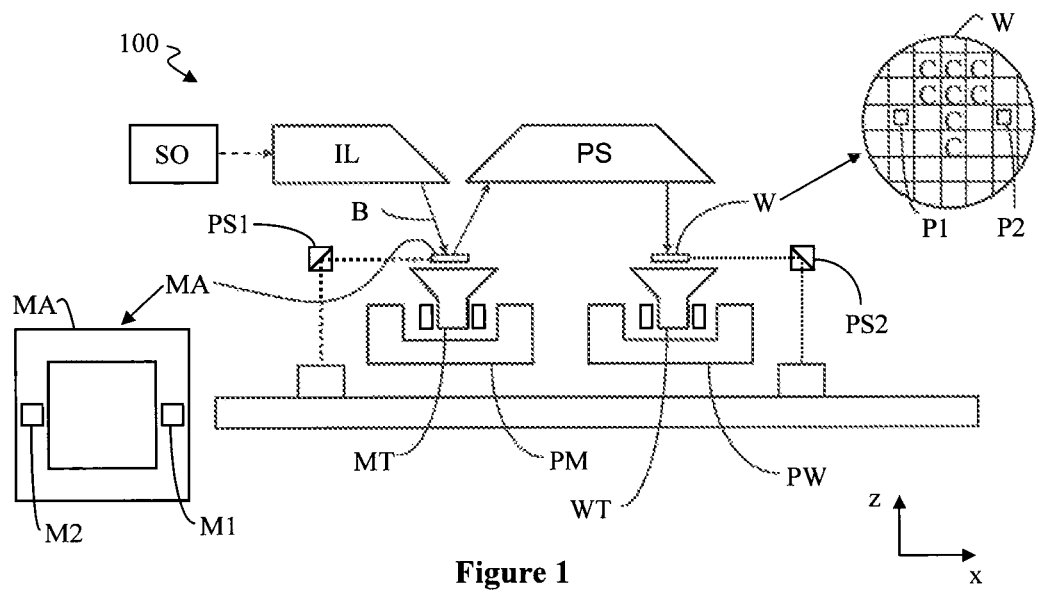
FIG. 1 depicts a lithographic apparatus according to an embodiment of the invention.

FIG. 1 schematically depicts a lithographic apparatus 100 according to one embodiment of the invention. The apparatus comprises:

- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As depicted here, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel with a laser beam. Fuel may for example be a droplet, stream or cluster of material having the required line-emitting element. The source collector module SO may be part of an EUV radiation system including a laser, not shown in FIG. 1, for providing the laser beam that excites the fuel. The resulting plasma emits output radiation, e.g., EUV radiation, which is collected using a radiation collector located in the source collector module. The laser and the source collector module may be separate entities, for example when a $CO_2$ laser is used to provide the laser beam for fuel excitation. In such cases, the laser is not considered to form part of the lithographic apparatus, and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
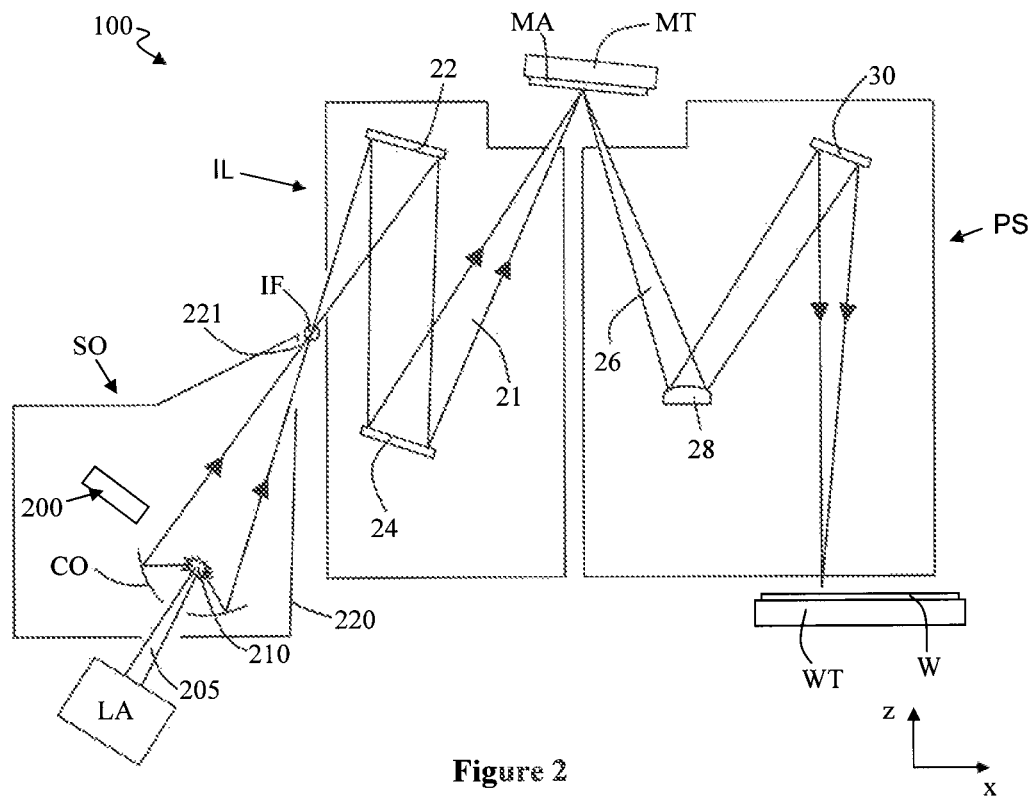
FIG. 2 shows the lithographic apparatus of FIG. 1 in more detail.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO.

A laser LA is arranged to deposit laser energy via a laser beam 205 into a fuel, such as xenon (Xe), tin (Sn) or lithium (Li) that is provided from a fuel supply 200, thereby creating a highly ionized plasma 210 with electron temperatures of several 10's of eV. The energetic radiation generated during de-excitation and recombination of these ions is emitted from the plasma, collected and focussed by a near normal incidence collector optic CO.

Radiation that is reflected by the collector optic CO is focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210.

Subsequently the radiation traverses the illumination system IL. The illumination system IL may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, a patterned beam 26 is formed and the patterned beam 26 is imaged by the projection system PS via reflective elements 28, 30 onto a substrate W held by the substrate table WT.

More elements than shown may generally be present in the illumination system IL and projection system PS. Further, there may be more mirrors present than those shown in the Figures, for example there may be 1-6 additional reflective elements present in the projection system PS than shown in FIG. 2.

Figure 3:
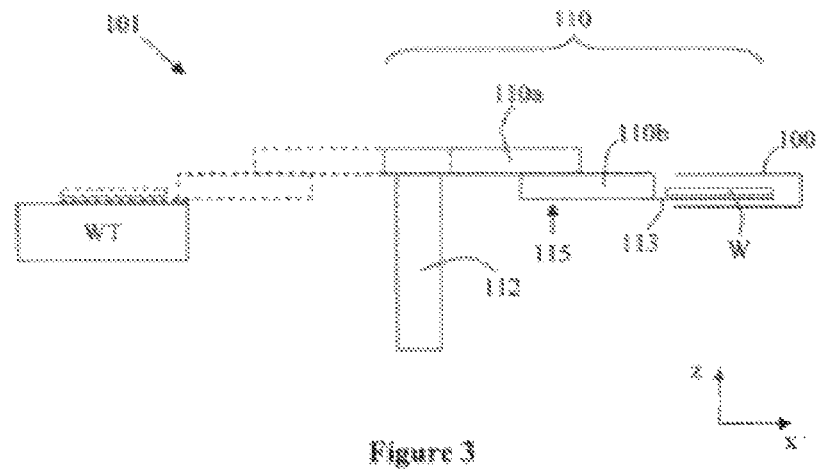
FIG. 3 shows an articulated arm of the lithographic apparatus according to an embodiment of the invention.

FIG. 3 shows schematically viewed from one side a substrate handling robot 101 that forms part of the lithographic apparatus shown in FIGS. 1 and 2. The substrate handling robot is used to transfer substrates W from a substrate holder 100 to the substrate table WT. The substrate handling robot 101 comprises an articulated arm 110 having an inner part 110a and an outer part 110b. The inner part 110a of the articulated arm is rotatably mounted on a support 112. The outer part 110b of the articulated arm is rotatably mounted on the inner part 110a of the articulated arm, thereby providing an articulated connection 115 between the inner part of the arm and the outer part of the arm.

In use, the articulated arm 110 is moved such that prongs 113 connected to the outer part 110b are pushed beneath a substrate W held in the substrate holder 100. The substrate W is then removed from the substrate holder 100 by moving the articulated arm 110. The articulated arm 110 is then used to move the substrate W such that the substrate is located over the substrate table WT. The articulated arm 110 then removes the prongs 113 from beneath the substrate W, thereby allowing the substrate to rest on the substrate table WT. Dashed lines show the position of the articulated arm and the substrate when the substrate is located over the substrate table WT. Once the substrate W is resting on the substrate table WT, the substrate table is moved until the substrate W is located beneath the projection system PS (see FIGS. 1 and 2), whereupon a pattern is projected onto the substrate as described further above.

Movement of the articulated arm 110 is achieved via rotation of the inner part 110a of the arm about the support 112, and via rotation of the outer part 110b of the arm about the inner part of the arm. Although only one articulated connection 115 is shown in FIG. 3 (between the inner part 110a and the outer part 110b of the articulated arm), more than one articulated connection may be provided. For example, the articulated arm may comprise an inner part, an outer part and an intermediate part, the inner part being connected via an articulated connection to the intermediate part, and the intermediate part being connected via an articulated connection to the outer part. Having more than one articulated connection provides improved control of the movement of the outer arm, thereby allowing improved control of the movement of the substrate W.

The articulated arm 110 may be provided in a vacuum (for example in an EUV lithographic apparatus), or some other environment in that it is desirable to avoid contamination. A motor (not shown) may be provided in the articulated connection 115. The motor, which may be electrical, may give rise to contamination such as particles of grease. It is desirable to prevent this contamination from entering the environment within which the articulated arm 110 is provided (or reducing the likelihood of contamination entering that environment).

Figure 4:
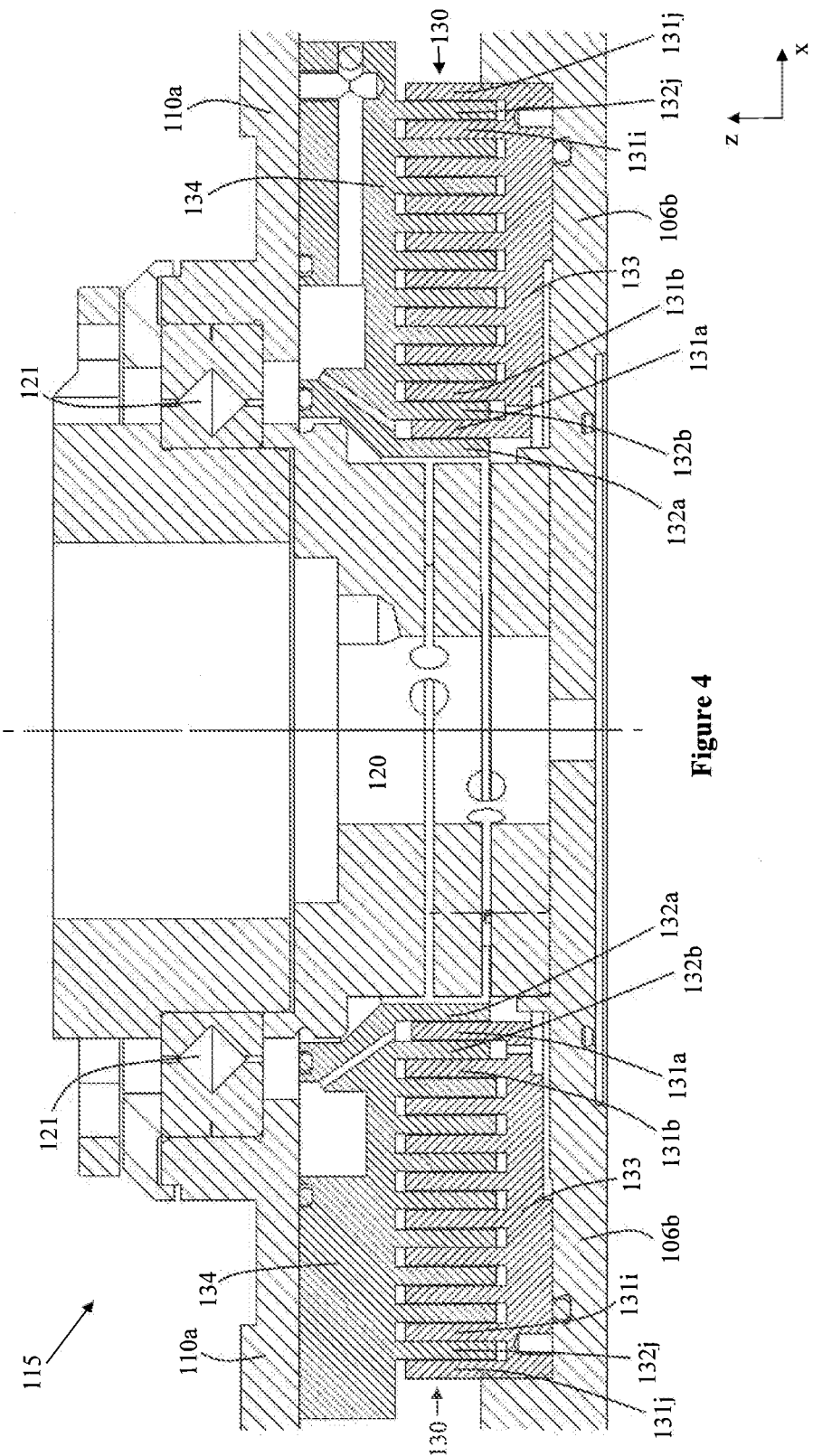
FIG. 4 shows a differential seal of the articulated arm according to an embodiment of the invention.

FIG. 4 shows schematically in cross-section part of the articulated connection 115 in more detail. A section of the inner part 110a of the articulated arm is shown in FIG. 4, together with a section of the outer part 110b of the arm. Rotation of the outer part 110b of the articulated arm relative to the inner part 110a is achieved by operating a motor 120 that is provided within the articulated connection 115. A bearing 121 is provided between the inner part 110a and the outer part 110b of the articulated arm. The bearing 121 is a ring bearing, which extends around the articulated connection 115 and facilitates smooth rotation of the articulated connection. In addition, the bearing 121 maintains a desired separation in the z-direction between the inner part 110a and the outer part 110b of the articulated arm.

A labyrinth seal 130 is provided between the inner part 110a and the outer part 110b of the articulated arm. The labyrinth seal 130 may be formed from aluminium, some other metal, or any other suitable material. The labyrinth seal 130 isolates (or substantially isolates) the motor 120 from the environment that surrounds the articulated arm 110. The labyrinth seal 130 thus reduces the likelihood that contamination generated by the motor 120 (for example grease particles) passes from the motor into the environment surrounding the articulated arm 110. The labyrinth seal 130 comprises a series of circular ridges 131a-j, which extend upwardly from a lower annular base 133 provided in the outer part 110b of the articulated arm, and a series of circular ridges 132a-j, which extend downwardly from an upper annular base 134 provided in the inner part 110a of the articulated arm. For simplicity not all of the circular ridges are labelled in FIG. 4. The circular ridges 131a-j, 132a-j have complementary dimensions such that all but one of the upwardly extending circular ridges 131a-i are received in spaces between downwardly extending circular ridges 132a-j. Similarly, all but one of the downwardly extending circular ridges 132b-j are received in spaces between upwardly extending circular ridges 131a-j.

Since the upwardly extending circular ridges 131a j, and downwardly extending ridges 132a-j are circular, they may rotate relative to one another. This allows the inner part 100a and the outer part 110b of the articulated arm to rotate relative to one another.

Figure 5:
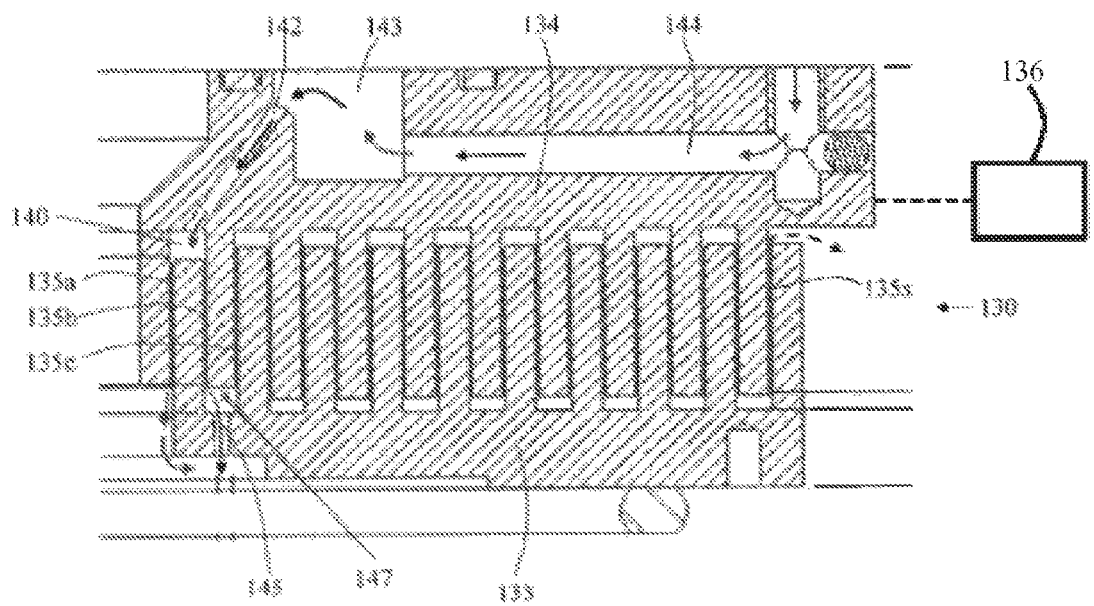
FIG. 5 shows part of the differential seal of FIG. 4 in more detail.

Part of the labyrinth seal is shown in more detail in FIG. 5. In FIG. 5 gaps between adjacent circular ridges are labelled rather than the circular ridges. (This is to allow the gaps to be identified without overcomplicating the figure.) Specific circular ridges that are referred to in this part of the description may be identified by referring to FIG. 4.

Referring to FIG. 5, a gap 135a-s exists between each adjacent circular ridge 131a-j, 132a-j. Each gap is narrow, for example 200 microns or less, thus restricting the flow of the gas through the gap. There are nineteen gaps in total in this embodiment (other embodiments may have a different number of gaps). The flow restrictions provided by each gap are added together to provide a cumulative flow restriction. This cumulative flow restriction severely restricts the flow of gas from inside the labyrinth seal to outside the labyrinth seal, thereby providing a sealing effect.

The upwardly extending circular ridges 131a-j do not extend as far as the upper annular base 134. Instead, a space exists between the top of each upwardly extending circular ridge 131a-d and the upper annular base 134. Similarly, the downwardly extending circular ridges 132a-j do not extend as far as the lower annular base 133. Instead, a space exists between the bottom of the downwardly extending circular ridges 132a-j and the lower annular base 133. The spaces that exist between the ends of the circular ridges 131a-j, 132a-j and the annular bases 133, 134 are significantly larger than the gaps between adjacent circular ridges. Thus, the spaces do not provide a significant contribution to the sealing effect provided by the labyrinth seal 130.

In an embodiment, the ridges may have a width of 2.82 mm, and a gap between adjacent ridges may for example be 3.18 mm. Thus, assuming that a ridge is centrally positioned between two adjacent ridges, the gaps between adjacent ridge surfaces may be 180 microns. A gap of 180 microns will provide a significant restriction of the flow of gas.

In contrast to this, the space between the end of a ridge 131a-j, 132a-j and an adjacent annular base 133, 134 may for example be 0.5 mm or more, 1 mm or more, or 1.5 mm or more. As mentioned above, the size of these spaces may be such that the spaces do not provide a significant sealing effect. The spaces do, however, provide scope for relative movement in the z-direction of the inner part 110a and outer part 110b of the articulated arm 110, and thus allow a degree of tilting between the inner and outer part of the articulated arm. The spaces may therefore allow an unwanted tilt of the substrate W to be corrected, by allowing adjustments to be made to the tilt of the outer part 110b of the arm to relative to the inner part 110a of the arm (and vice versa). The spaces may also accommodate production tolerances arising during manufacture of the labyrinth seal, such as centricity, flatness and height of the circular ridges.

It may be seen from FIGS. 4 and 5 that the space between the first upwardly extending circular ridge 131a and the upper annular base 134 is greater than other equivalent spaces in the labyrinth seal. This space is referred to hereafter as the initial upper space 140. The initial upper space 140 receives gas from a plurality of inlet channels 142 (only one of which is shown in FIG. 5), which are connected to an internal reservoir 143 provided within the upper annular base 134. The internal reservoir 143 is connected via a gas supply channel 144 to a source of gas (not shown). The gas supply may for example supply nitrogen or some other gas to the labyrinth seal. The flow of gas through the channels 142, 144 and internal reservoir 143 is indicated schematically by arrows.

The internal reservoir 143 is annular in shape, and extends around the labyrinth seal. The internal reservoir 143 thus acts as a channel that carries gas from the gas supply channel 144 to the inlet channels 142.

Once gas has been delivered to the initial upper space 140 by the inlet channels 142, some of the gas passes through the first gap 135a, i.e., between the first downwardly extending circular ridge 132a and the first upwardly extending circular ridge 131a. The inlet channels 142 may thus be said to be connected to the first gap 135a (via the initial upper space 140). The gas that passes through the first gap 135a flows to a gas outlet (not shown) that is connected to a pump (not shown) used to pump gas from the labyrinth seal. The flow of gas, which is indicated by arrows, inhibits contamination from entering the labyrinth seal 130, since the contamination is instead pumped from the labyrinth seal.

Some of the gas delivered to the initial upper space 140 by the inlet channels 142 flows through the second gap 135b, i.e., between the first upwardly extending circular ridge 131a and the second downwardly extending circular ridge 132b. The inlet channels 142 may thus be said to be connected to the second gap 135b (via the initial upper space 140). The gas then enters a lower space 147 that is connected to a plurality of outlet channels 145 (only one of which is shown in FIG. 5). The outlet channels 145 may be said to be connected to the second gap 135b via the lower space 147. The outlet channels 145 are connected to the gas outlet and the pump, which is used to pump the gas from the labyrinth seal. The flow of gas, which is indicated by an arrow, inhibits contamination from entering the remainder of the labyrinth seal 130, since the contamination is instead pumped from the labyrinth seal.

In an embodiment, not all of the gas is removed from the labyrinth seal 130 by the pump. The remaining gas passes through the third gap 135c, i.e., between the second downwardly extending circular ridge 131b and the second upwardly extending circular ridge 132b, and may continue to travel through successive gaps along the length of the labyrinth seal. As explained further above, the narrowness of the gaps is such that they restrict the flow of the gas. The cumulative effect of the nineteen gaps of the labyrinth seal 130 may be such that only a small amount gas exits the labyrinth seal. This is shown schematically by a dashed arrow.

The length of the path travelled by the gas through the labyrinth seal, together with the narrowness of the gaps 135a-s, is such that the flow of gas out of the labyrinth seal is weak, and is such that contamination is unlikely to escape from the labyrinth seal. Thus, the labyrinth seal 130 isolates (or substantially isolates) the environment surrounding the articulated arm 110 from the motor 120, which is used to move the articulated connection 115 of the arm. Use of the term 'seal' is not intended to mean that no gas escapes into the environment surrounding the articulated arm.

The initial upper space 140 provides buffering of the gas delivered through the inlet channels 142, and thereby avoids a large pressure drop at the exit of the inlet channels 142. The lower space 147 similarly provides buffering that avoids a large pressure drop at the entrance of the outlet channels 145, which leads to the pump (not shown). By providing buffering at the initial upper and lower spaces 140, 141, unwanted circumferential flow of gas around the labyrinth seal 130 is avoided.

FIGS. 4 and 5 show the labyrinth seal 130 in cross-section. Consequently, they do not distinguish between a gap or other opening that extends circumferentially around the labyrinth seal, and a channel that does not extend circumferentially around the labyrinth seal. Referring again to FIG. 5, the gaps 135a-s between the circular ridges 131a-j, 132a-j extend around the labyrinth seal 130. Similarly, the spaces between the circular ridges 131a-j, 132a-j and the annular bases 133, 134 extend around the labyrinth seal. As mentioned above, the internal reservoir 143 is annular in shape and extends around the labyrinth seal. In contrast to this, the inlet channel 142 that connects the internal reservoir 143 to the initial upper gap 140 is not annular, but instead may be a bore that may, for example, be circular in cross-section. A plurality of inlet channels 142 may be distributed around the labyrinth seal 130, providing a plurality of connections between the internal reservoir 143 and the initial upper gap 140. In an embodiment, four or more inlet channels, eight or more inlet channels, or twelve or more inlet channels may be provided.

The channel 144 connects the gas supply (not shown) to the internal reservoir 143 may also be a bore. Since this channel has a relatively large cross-section, a single channel may be sufficient to supply a required amount of gas to the internal reservoir 143. More than one channel may be provided. The outlet channel 145, which carries gas from the lower space 147 to the pump (not shown). may also be a bore that may for example be circular in cross-section. A plurality of outlet channels 145 may be distributed around the labyrinth seal 130, providing a plurality of connections between the lower space 147 and the pump. In an embodiment, four or more outlet channels, eight or more outlet channels, or twelve or more outlet channels may be provided.

The speed of flow of gas through the first gap 135a may have an effect upon the contamination suppression, which is provided by the labyrinth seal. A higher gas flow speed will provide more effective limitation of contamination than a lower gas flow speed, since it will reduce the likelihood of contamination entering the labyrinth seal 130. Providing a larger number of inlet channels 142 to the initial upper gap 140, or increasing the diameter of the channels, will increase the gas flow and thus increase the contamination suppression provided by the labyrinth seal. However, it is desirable to avoid a large pressure drop at the initial upper gap 140, and a larger number of inlet channels or larger inlet channel diameter may cause a greater pressure drop. Thus, the number and/or size of the inlet channels 142 may be a compromise arising from the high gas flow provided by a large number and/or size of inlet channels and the small pressure drop caused by a small number and/or size of inlet channels. In an embodiment twelve inlet channels 142 may be used, each inlet channel having a diameter of 1.4 mm. In alternative embodiments, the number of inlet channels and the diameters of the inlet channels may differ.

Although it may be desirable to avoid a pressure drop at the initial upper gap 140 or initial lower gap 141, it is not essential that a pressure drop is avoided.

As mentioned further above, a proportion of the gas that is introduced via the inlet channels 142 is removed from the labyrinth seal 130 by the pump (not shown) via the outlet channels 145. Removing gas from the labyrinth seal is advantageous because it allows a higher gas flow to be provided at the first gap 135a (thereby providing stronger contamination suppression), without that higher gas flow causing an unacceptably high amount of gas to enter the environment surrounding the articulated arm by passing from the final gap 135s of the labyrinth seal.

Although the pump is connected to an outlet channel 145 and lower space 147 that are connected to the first and second gaps 135a,b, the pump may be connected to one or more other locations in the labyrinth seal. The pump may be connected to the labyrinth seal such that it removes gas from the labyrinth seal before that gas travels to the outside of the labyrinth seal.

In an embodiment, there may be the same number of inlet channels 142 and outlet channels 145. In an embodiment, the number of inlet channels 142 may be different to the number of outlet channels 145.

The bearing 121 may for example be a barrel bearing. Although only one bearing 121 is shown in FIG. 4, in other embodiments more than one bearing may be used. It may be desirable to use more than one bearing for example if the moments of force that will be exerted on the articulated arm 110 are large.

The circular ridges 131a-j, 132a-j may include a degree of tapering. This tapering may allow greater tilt correction to be achieved than would be the case than if the tapering were not present.

A maximum pressure that may exist in the environment of the motor 120 may be determined by first calculating an acceptable rate of leakage of gas into the environment surrounding the articulated arm 110, and then determining what pressure will give rise to that leak rate, taking into account the path length of the labyrinth seal and the size of gaps between adjacent circular ridges. In an embodiment, the vacuum in the environment that surrounds the articulated arm 110 may have a pressure of approximately 1 Pascal. The motor 120 within the articulated arm 110 may be in an environment that has a vacuum of around 4 millibars.

Although the above description refers to the labyrinth seal 130 forming part of an articulated arm 110, which is used to move a substrate W, the labyrinth seal 130 may be provided in other articulated connections. The labyrinth seal may be provided in an articulated arm that is configured to move a mask or other patterning device, or indeed any other piece of apparatus.

The labyrinth seal 130 is intended to limit the flow of gas from one side of the seal to the other, and also the flow of contamination from one side of the seal to the other. The labyrinth seal is not intended to prevent all gas from flowing from one side of the seal to the other, but merely to restrict the flow of gas.

In an embodiment, the labyrinth seal 130 may be connected to a power supply 136, which is configured to electrostatically charge the labyrinth seal. This will increase the likelihood that contamination will be incident upon a surface of the labyrinth seal and be retained by the labyrinth seal. Where this is done, the upper and lower annular bases 133, 134 may be electrically isolated from other parts of the lithographic apparatus, in order to prevent for example the creation of earth loops within the lithographic apparatus.

It is not desirable for adjacent circular ridges 131a-j, 132a-j to come into contact with one another, since this would be likely to generate contamination. If the labyrinth seal 130 is electrostatically charged, then electrical monitoring may be used to detect contact between adjacent circular ridges. The electrical monitoring may be used during assembly or testing of the labyrinth seal, and may be used during operation of the lithographic apparatus. The electrical monitoring may for example measure resistance or capacitance. Where capacitance is measured, it may be possible to monitor the separation between adjacent circular ridges rather than only monitoring for contact between them.

From the point of view of the contamination suppression and pressure isolation provided by the labyrinth seal 130, the gaps 135a-s between adjacent circular ridges 131a-j, 132a-j should be as small as possible. However, from an engineering point of view, the smaller the gaps 135a-s the greater the chance that the circular ridges will come into contact with one another. From an engineering point of view, it may be possible to reliably provide gaps of as little as 50 microns between adjacent circular ridges. However, it may be less costly to provide larger gaps. Thus, the gaps may be 50 microns or greater, 100 microns or greater, 150 microns or greater, or 200 microns or greater. These example gap sizes may apply to embodiments of the invention other than that shown in FIGS. 4 and 5.

To some extent, an increase of the gap width may be compensated for by making the gap longer. However, although the resistance to gas flow increases linearly with length, it decreases to a higher power as the gap width increases. Thus, a very large gap width might require a prohibitively long gap.

In addition to depending on the width of the gaps 135a-s between adjacent circular ridges 131a-j, 132a-j, the effectiveness of the labyrinth seal 130 will also depend on the total length of all of the gaps that must be travelled in order to go from one side of the labyrinth seal to the other side. This length is referred to hereafter as the gap path-length. The spaces between ends of circular ridges 131a-j, 132a-j and annular bases 133, 134 do not provide a significant restriction of the flow of gas, and thus are not included in the gap path-length. In the illustrated embodiment of the invention, there are nineteen gaps 135a-s through that gas must pass, each gap having a length of approximately 10 mm. Thus, the gap path-length of the labyrinth seal 130 is approximately 190 mm. Other embodiments of the invention may provide other gap path-lengths, for example using less circular ridges to reduce the gap path-length, or more circular ridges to increase the gap path-length. Similarly, each circular ridge may be made shorter to reduce the gap path-length, or longer to increase the gap path length.

Although the labyrinth seal 130 of the embodiment of the invention is provided between the inner part 110a and the outer part 110b of the articulated arm 110, the labyrinth seal may be provided at other locations. For example, the labyrinth seal 130 may be provided between the support 112 and the inner part 110a of the articulated arm 110.

Figure 6:
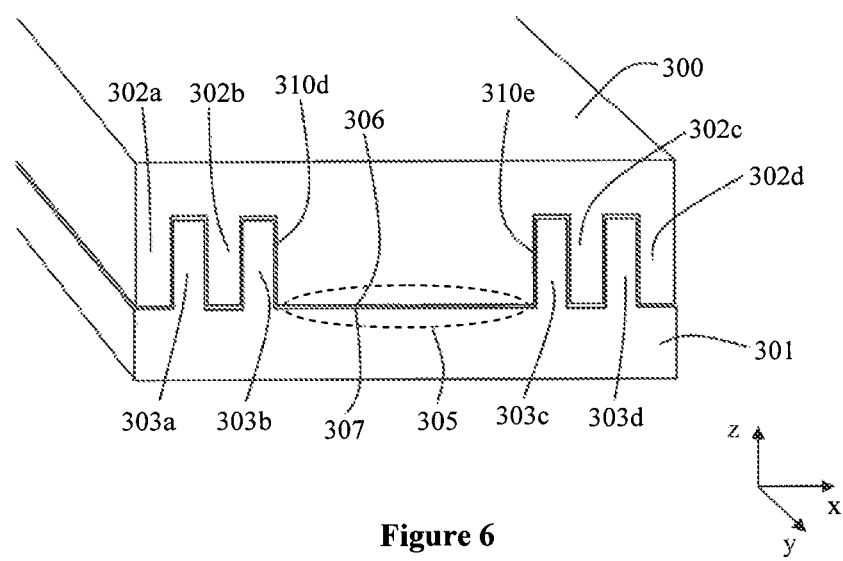
FIG. 6 shows a differential seal according to an alternative embodiment of the invention.

An alternative embodiment of the invention is shown schematically in FIG. 6. In this embodiment, a cavity (not visible) is defined by an upper surface 300 and a lower surface 301. The upper surface 300 is provided with two downwardly extending ridges 302a,b at a left hand side and two downwardly extending ridges 302c,d at a right hand side. Similarly, the upper surface 301 is provided with two upwardly extending ridges 303a,b at a left hand side and two upwardly extending ridges 303c,d at a right hand side. The upwardly extending ridges 303a-d are received in spaces between the downwardly extending ridges 302a-d, thereby establishing a labyrinth seal. The upper surface 300 may be supported by bearings (not shown), which allow the upper surface to move in the y-direction relative to the lower surface 301. Alternatively or additionally, the lower surface 301 may be mounted on bearings (not shown), which allow the lower surface to move relative to the upper surface 300.

A motor or other apparatus (not shown) may be provided in the cavity located between the upper surface 300 and the lower surface 301. The ridges 302a-d, 303a-d may provide a labyrinth seal that restricts the flow of gas from the cavity to the environment surrounding the upper and lower surfaces 300, 301. The gap between the upper surface 300 and the lower surface 301 may for example be around 200 microns. This gap, in combination with the gap path length defined by the ridges 302a-d, 303a-d may provide a differential seal between the cavity and the environment surrounding the upper and lower surfaces. Although only two upwardly extending ridges and two downwardly extending ridges are shown on either side of the surfaces 300, 301, more ridges may be provided. For example, three or more ridges, five or more ridges, or ten or more ridges may be provided on either side of the surfaces.

In a central region 305 between the ridges 302a-d, 303a-d no ridges are provided. Ridges are not provided in the central region 305 because ridges that extend in a direct line of sight from the cavity (in this case in the y-direction) would not provide a sealing effect. This is because gas would not flow over the ridges but would merely travel between them. Instead of providing ridges at the central region 305, the central region comprises a first flat surface 306 and a second flat surface 307. The first and second flat surfaces 306, 307 are separated for example by around 200 microns, and thus restrict the flow of gas from the cavity. The effectiveness of the flat surfaces 306, 307 in restricting the flow of gas is determined by the gap between the flat surfaces and the path-length of the flat surfaces. The gap may be 200 microns, and the path-length may for example be 200 mm. The path-length may be the same as or different to the path length travelled by gas that passes over the ridges 302a-d, 303a-d. Thus, the flat surfaces 306, 307 may provide a differential sealing effect that is equal to or greater than that provided by the ridges. Although the surfaces 306, 307 shown in FIG. 6 are flat, they may be any suitable shape (for example they may be curved).

Gas may be supplied to the labyrinth seal shown in FIG. 6 in a manner that is equivalent to that described above in relation to FIG. 5. For example, gas may be introduced above innermost upwardly extending ridges 303b,c and may travel into a first gap 310d,e defined by the upper surface 300 and the lower surface 301. Gas may be pumped out of the labyrinth seal at the bottom of the first gap 310d,e. The gas may be supplied via a plurality of inlet channels (not shown), and may be pumped out of the labyrinth seal via a plurality of outlet channels (not shown).

In the labyrinth seals shown in the illustrated embodiments, the ridges that form the seals extend upwardly and downwardly. In alternative embodiments, the ridges may extend from left to right and from right to left. Indeed, the ridges may have any orientation.

Cartesian coordinates are used in the figures for convenience, and should not be interpreted as implying that the apparatus illustrated in the figures must have a particular orientation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. An actuator comprising:
   a first part and a second part, the first part being configured to move relative to the second part; and
   a labyrinth seal provided between the first part and the second part, the labyrinth seal being configured to restrict the flow of gas from a first side of the labyrinth seal to a second side of the labyrinth seal,
   wherein one or more inlets and one or more outlets are provided within the labyrinth seal, the one or more inlets being configured to provide gas to a location within the labyrinth seal and the one or more outlets being configured to remove at least part of the gas from a location within the labyrinth seal;
   wherein the one or more inlets are located between an innermost gap and a neighboring gap of the labyrinth seal, the one or more inlets being located at one end of the gaps.

2. The actuator of claim 1, wherein the labyrinth seal is rotationally symmetric.

3. The actuator of claim 1, wherein the labyrinth seal comprises a plurality of ridges, gaps being present between adjacent ridges that are sufficiently narrow to restrict the flow of gas.

4. The actuator of claim 3, wherein the gaps are 50 microns wide or more.

5. The actuator of claim 4, wherein gaps are 150 microns wide or more.

6. The actuator of claim 5, wherein spaces are present between ends of ridges of a first part of the labyrinth seal and an adjacent base of a second part of the labyrinth seal, the spaces being sufficiently wide that they do not significantly restrict the flow of gas.

7. The actuator of claim 6, wherein the actuator is configured to allow a tilt to be introduced between the first and second part of the labyrinth seal, the tilt being accommodated at least in part by the spaces between ends of the ridges and the adjacent base.

8. The actuator of claim 1, wherein a space is provided between the one or more inlets and the innermost gap, and between the one or more inlets and the neighboring gap, the space being configured to provide buffering of the gas delivered through the one or more inlets.

9. The actuator of claim 1, wherein the one or more outlets are located between the innermost gap and the neighboring gap of the labyrinth seal, the one or more outlets being located at an opposite end of the gaps from the one or more inlets.

10. The actuator of claim 9, wherein a space is provided between the one or more outlets and the innermost gap, and between the one or more outlets and the neighboring gap, the space being configured to provide buffering of the gas passing to the one or more outlets.

11. The actuator of claim 1, wherein the actuator is a linear actuator and the labyrinth seal comprises a plurality of linear ridges, gaps being present between adjacent ridges that are sufficiently narrow to restrict the flow of gas.

12. The actuator of claim 11, wherein the labyrinth seal further comprises two surfaces that are not provided with ridges, a gap being present between the surfaces that is sufficiently narrow to restrict the flow of gas.

13. The actuator of claim 1, wherein the actuator comprises an articulated arm.

14. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a substrate handling robot configured to position the substrate, the robot having a actuator with a first part and a second part, the first part being configured to move relative to the second part, and a labyrinth seal provided between the first part and the second part, the labyrinth seal being configured to restrict the flow of gas from a first side of the labyrinth seal to a second side of the labyrinth seal, wherein one or more inlets and one or more outlets are provided within the labyrinth seal, the one or more inlets being configured to provide gas to a location within the labyrinth seal and the one or more outlets being configured to remove at least part of the gas from a location within the labyrinth seal;

wherein the one or more inlets are located between an innermost gap and a neighboring gap of the labyrinth seal, the one or more inlets being located at one end of the gaps; and a projection system configured to project the patterned radiation beam onto a target portion of the substrate.

15. The lithographic apparatus of claim 14, wherein the labyrinth seal is electrically isolated from other parts of the lithographic apparatus and is connected to a power supply configured to electrostatically charge the labyrinth seal.

16. A method of sealing an actuator comprising a first part and a second part, the first part being configured to move relative to the second part, using a labyrinth seal, the labyrinth seal being provided between the first part and the second part, the method comprising;

introducing gas into the labyrinth seal via one or more inlets located between an innermost gap and a neighboring gap of the labyrinth seal, the one or more inlets being located at one end of the gaps; and removing gas from the labyrinth seal via one or more outlets connected to a location within the labyrinth seal.

* * * * *